(12) United States Patent
Shimura

(10) Patent No.: US 8,593,879 B2
(45) Date of Patent: Nov. 26, 2013

(54) NONVOLATILE SEMICONDUCTOR MEMORY DEVICE

(75) Inventor: Yasuhiro Shimura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 100 days.

(21) Appl. No.: 13/423,511

(22) Filed: Mar. 19, 2012

(65) Prior Publication Data

US 2013/0070525 A1 Mar. 21, 2013

(30) Foreign Application Priority Data

Sep. 21, 2011 (JP) ................................ 2011-206393

(51) Int. Cl.
*G11C 11/34* (2006.01)
*G11C 16/06* (2006.01)

(52) U.S. Cl.
USPC ............ 365/185.22; 365/185.03; 365/185.05; 365/185.24

(58) Field of Classification Search
USPC ............... 365/185.03, 185.05, 185.09, 185.2, 365/185.16, 185.17, 185.22, 185.18, 365/185.19, 185.24, 185.28
See application file for complete search history.

(56) References Cited

U.S. PATENT DOCUMENTS

| | | | |
|---|---|---|---|
| 2010/0329036 A1* | 12/2010 | Park | 365/185.25 |
| 2012/0195120 A1* | 8/2012 | Iwai | 365/185.03 |
| 2012/0201077 A1* | 8/2012 | Nagao | 365/185.03 |

FOREIGN PATENT DOCUMENTS

| | | |
|---|---|---|
| JP | 2001-23384 | 1/2001 |
| JP | 2009-37720 | 2/2009 |

* cited by examiner

*Primary Examiner* — Vanthu Nguyen
*Assistant Examiner* — Hien Nguyen
(74) *Attorney, Agent, or Firm* — Oblon, Spivak, McClelland, Maier & Neustadt, L.L.P.

(57) ABSTRACT

A nonvolatile semiconductor memory device according to an embodiment includes a control circuit controlling a read operation of applying a read voltage to a selected memory cell to read data, and a write verify operation of applying a verify voltage to the selected memory cell. In a first case, the control circuit sets a voltage to a first write verify voltage and a first read voltage. In a second case in which the memory cells deteriorate more than in the first case, the control circuit sets a voltage to a second write verify voltage and a second read voltage. The control circuit sets a difference between a maximum value of the first write verify voltage and a maximum value of the first read voltage to be more than a difference between a maximum value of the second write verify voltage and a maximum value of the second read voltage.

20 Claims, 10 Drawing Sheets

US 8,593,879 B2

NONVOLATILE SEMICONDUCTOR MEMORY DEVICE

CROSS REFERENCE TO RELATED APPLICATION

This application is based upon and claims the benefit of priority from prior Japanese Patent Application No. 2011-206393, filed on Sep. 21, 2011, the entire contents of which are incorporated herein by reference.

BACKGROUND

1. Field

Embodiments described herein relate to a nonvolatile semiconductor memory device.

2. Description of the Related Art

There is a rapidly increasing demand for a NAND flash memory with an increase in a use of large-capacity data, such as images or moving pictures in, for example, mobile apparatuses. In particular, the use of a multi-value storage technique capable of storing information of two bits or more in one memory cell enables a large amount of information to be stored in a small chip area.

In the high-density flash memories in which the memory cells are formed by a microfabrication technique, a memory cell with little deterioration immediately after shipment and a memory cell which deteriorates due to the repetition of write/erase operations have different threshold voltage change characteristics during the write/erase operations. In addition, a change in the threshold voltage through time after the write operation depends on the deteriorating state of the memory cell.

DETAILED DESCRIPTION

A nonvolatile semiconductor memory device according to an embodiment includes: a plurality of memory cells each configured to hold a threshold voltage included in any one of a plurality of threshold voltage distributions; a memory cell array having NAND cell units arranged therein, each of the NAND cell units including a memory string and selection transistors, the memory string configured by the memory cells connected in series, and one of the selection transistors being connected to each end of the memory string, respectively; word lines connected to the memory cells; bit lines each connected to first end of the NAND cell unit; a source line connected to second ends of the NAND cell units; and a control circuit configured to control a read operation, a write operation, and a write verify operation, the read operation being an operation of selecting one of the memory cells as a selected memory cell and applying a read voltage to a selected word line connected to the selected memory cell to read data, the write operation being an operation of writing data to the selected memory cell, and the write verify operation being an operation of applying a verify voltage to the selected word line and determining whether a certain data is written to the selected memory cell. In a first case, the control circuit sets a voltage applied to the selected word line to a first write verify voltage to perform the write verify operation, and sets a voltage applied to the selected word line to a first read voltage to perform the read operation. In a second case in which the memory cells deteriorate more than in the first case, the control circuit sets a voltage applied to the selected word line to a second write verify voltage to perform the write verify operation, and sets a voltage applied to the selected word line to a second read voltage to perform the read operation. The control circuit sets a difference between a maximum value of the first write verify voltage and a maximum value of the first read voltage to be more than a difference between a maximum value of the second write verify voltage and a maximum value of the second read voltage.

Next, nonvolatile semiconductor memory devices according to embodiments will be described with reference to the accompanying drawings.

First Embodiment

[Configuration]

Figure 1:
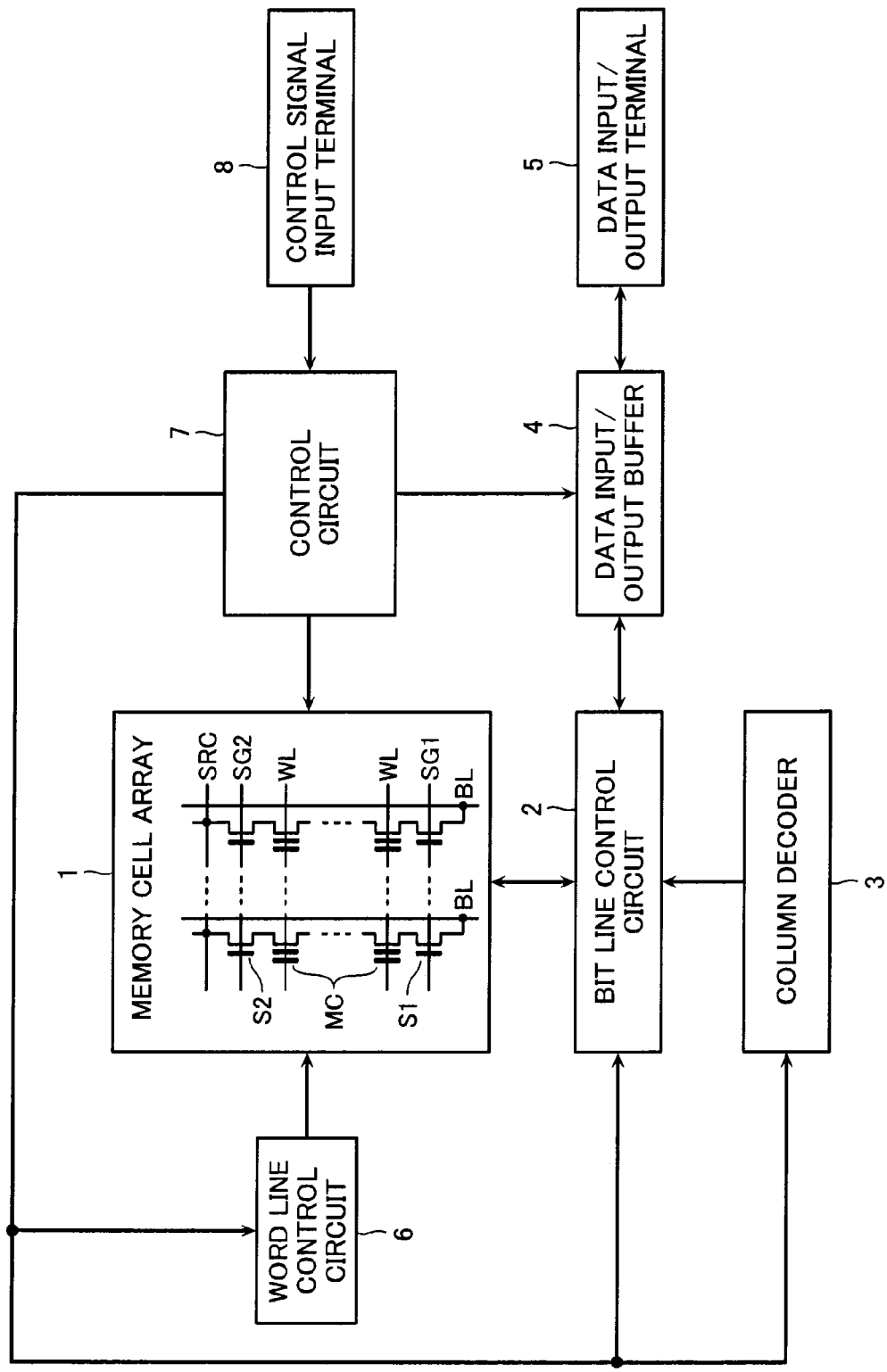
FIG. 1 is a block diagram illustrating a schematic configuration of a nonvolatile semiconductor memory device according to an embodiment.

FIG. 1 is a diagram illustrating a configuration of a nonvolatile semiconductor memory device according to a first embodiment. The nonvolatile semiconductor memory device is a NAND flash memory of a four-value data storage type. The nonvolatile semiconductor memory device includes a memory cell array 1 in which memory cells MC for storing data are arranged in a matrix. The memory cell array 1 includes a plurality of bit lines BL, a plurality of word lines WL, a source line SRC, and a plurality of memory cells MC. The memory cell MC has a stacked gate structure including a floating gate electrode serving as a charge accumulation layer for storing charges and a control gate electrode that is connected to the word line WL. The memory cell MC is configured to be capable of being electrically rewritable of data by the injection or emission of charges into or from the floating gate electrode. The memory cells MC are arranged in a matrix, each of the memory cells MC being disposed at the intersections of the bit lines BL and the word lines WL, respectively.

A bit line control circuit 2 for controlling the voltage of the bit line BL and a word line control circuit 6 for controlling the voltage of the word line WL are connected to the memory cell array 1. The bit line control circuit 2 reads the data of the memory cells MC in the memory cell array 1 through the bit line BL. In addition, the bit line control circuit 2 applies a control voltage to the memory cells MC in the memory cell array 1 through the bit lines BL and writes data to the memory cells MC.

A column decoder 3 and a data input/output buffer 4 are connected to the bit line control circuit 2. The data of the memory cell MC read from the memory cell array 1 is output from the data input/output terminal 5 to the outside through the data input/output buffer 4. In addition, write data input to the data input/output terminal 5 from the outside is input to the bit line control circuit 2 through the data input/output buffer 4 and is then written to a designated memory cell MC.

The memory cell array 1, the bit line control circuit 2, the column decoder 3, the data input/output buffer 4, and the word line control circuit 6 are connected to a control circuit 7. The control circuit 7 generates control signals for controlling the memory cell array 1, the bit line control circuit 2, the column decoder 3, the data input/output buffer 4, and the word line control circuit 6 in response to the control signals input to the control signal input terminal 8.

Figure 2:
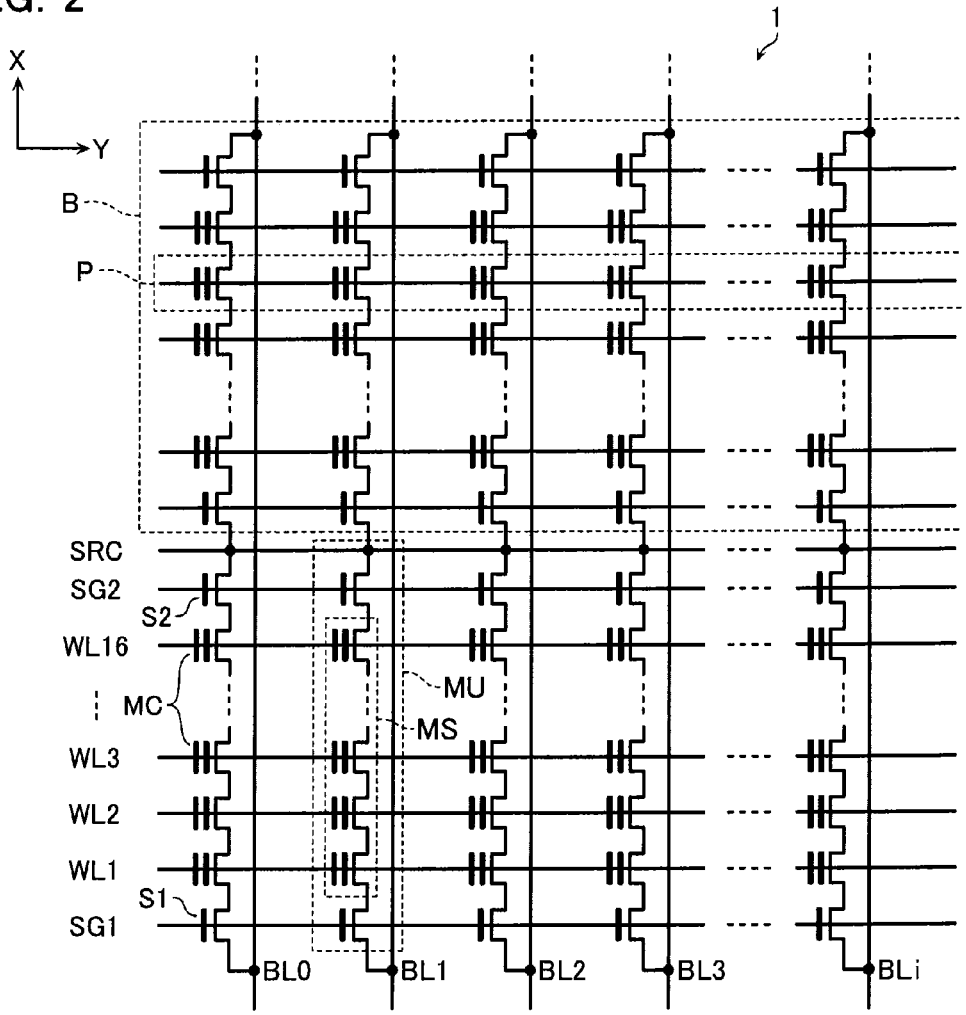
FIG. 2 is a circuit diagram illustrating a configuration of a memory cell array 1 illustrated in FIG. 1.

FIG. 2 is a diagram illustrating the configuration of the memory cell array 1 illustrated in FIG. 1. As illustrated in FIG. 2, the memory cell array 1 includes a plurality of blocks B. In the memory cell array 1, data is erased in a block B basis (block erasing process). As illustrated in FIG. 2, the block B is configured so as to include a plurality of memory units MU. One memory unit MU includes a memory string MS including, for example, 16 memory cells MC connected in series and first and second selection gate transistors S1 and S2 that are connected to both ends of the memory string MS, respectively. One end of the first selection gate transistor S1 is connected to the bit line BL and one end of the second selection gate transistor S2 is connected to the source line SRC. The control gates of the memory cells MC arranged in a line in the Y direction are commonly connected to any one of the word lines WL1 to WL16. In addition, the control gates of the first selection gate transistors S1 arranged in a line in the Y direction are commonly connected to the selection gate line SG1 and the control gates of the second selection gate transistors S2 arranged in a line in the Y direction are commonly connected to the selection gate line SG2. A set P of a plurality of memory cells MC connected to one word line WL forms one page or a plurality of pages. Data is written to or read from each set P.

[Data Storage System]

Figure 3:
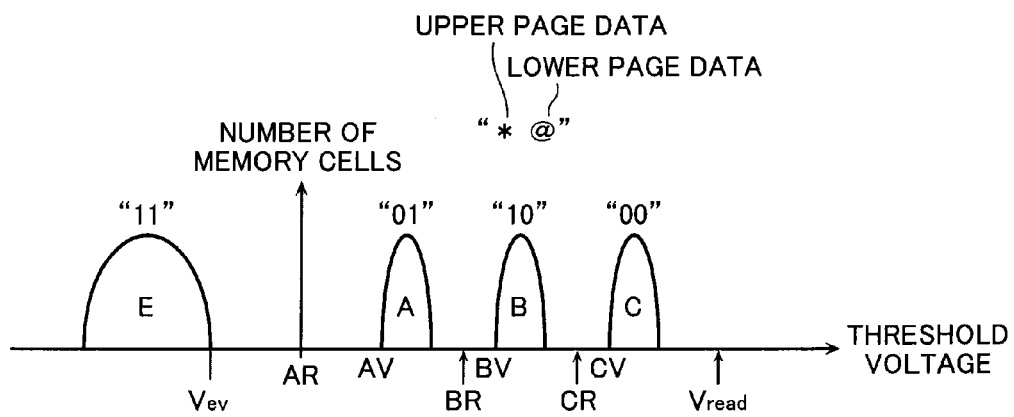
FIG. 3 is a diagram illustrating an example of written data in a flash memory of a four-value data storage type.

Next, a data storage system of the nonvolatile semiconductor memory device will be described in brief. The nonvolatile semiconductor memory device is configured such that the threshold voltage of the memory cell MC may have four distributions. FIG. 3 is a diagram illustrating the relation between the threshold voltage distributions of the memory cells MC and four-value data of 2-bit (data "11", "01", "10", and "00") stored in the memory cell MC of the nonvolatile semiconductor memory device.

In FIG. 3, voltages AR, BR, and CR are read voltages applied to the selected word line WL when four-value data are read. The voltage AR is between the upper limit of a threshold voltage distribution E and the lower limit of a threshold voltage distribution A. Among the voltages AR, BR, and CR, the voltage AR has the lowest level. The voltage BR is higher than the voltage AR and is between the upper limit of the threshold voltage distribution A and the lower limit of the threshold voltage distribution B. The voltage CR is higher than the voltage BR and is between the upper limit of the threshold voltage distribution B and the lower limit of a threshold voltage distribution C. The voltages AV, BV, and CV are verify voltages which are applied in order to determine whether the write operation is completed when data of the threshold voltage distributions A, B, or C is to be written. The voltages AV, BV, and CV are set to the lower limits of the threshold voltage distributions A, B, and C, respectively. When data is read, a voltage Vread is a read pass voltage which is applied to a non-selected memory cell MC in the memory string MS and electrically turns on the non-selected memory cell MC, regardless of the data stored in the non-selected memory cell MC. A voltage Vev is an erase verify voltage which is applied to the memory cell MC in order to determine whether the erasing of data is completed when the data in the memory cell MC is to be erased. The following magnitude relation is established among the voltages: Vev<AR<AV<BR<BV<CR<CV<Vread.

In the threshold voltage distribution E of the memory cells MC after the block is erased, the upper limit thereof is also a negative value and data "11" is allocated to the threshold voltage distribution E. The memory cells MC having data "01", "10", or "00" written thereto have the positive threshold voltage distributions A, B, or C, respectively (that is, the lower limits of the distributions A, B, and C are also positive values). The threshold voltage distribution A of the data "01" has the minimum voltage value, the threshold voltage distribution C of the data "00" has the maximum voltage value, and the threshold voltage distribution B of the data "10" has an intermediate voltage value between the voltage values of the threshold voltage distributions A and C. As illustrated in FIG. 3, 2-bit data in one memory cell MC includes lower page data and upper page data. When data is represented by "*@", "*" indicates the upper page data and "@" indicates the lower page data.

As the result of the miniaturization of the memory cells, there is a large dispersion in the operation characteristics between the memory cell with little deterioration immediate after shipment and the memory cell which has deteriorated due to the repetition of the write/erase operations. Specifically, in the memory cell MC which has deteriorated, the width of the threshold voltage distribution immediately after the write operation is more than that in the memory cell MC with little deterioration. Data retention operation in the memory cell which has deteriorated is different from that in the memory cell MC with little deterioration. In this case, the inventors found that, in the read operation and the write verify operation, when the read voltages (AR, BR, and CR) and the write verify voltages (AV, BV, and CV) were set to the same value before and after the memory cell MC deteriorated, an operation error was likely to occur.

[Operation of Nonvolatile Semiconductor Memory Device According to Comparative Example]

Figure 4:
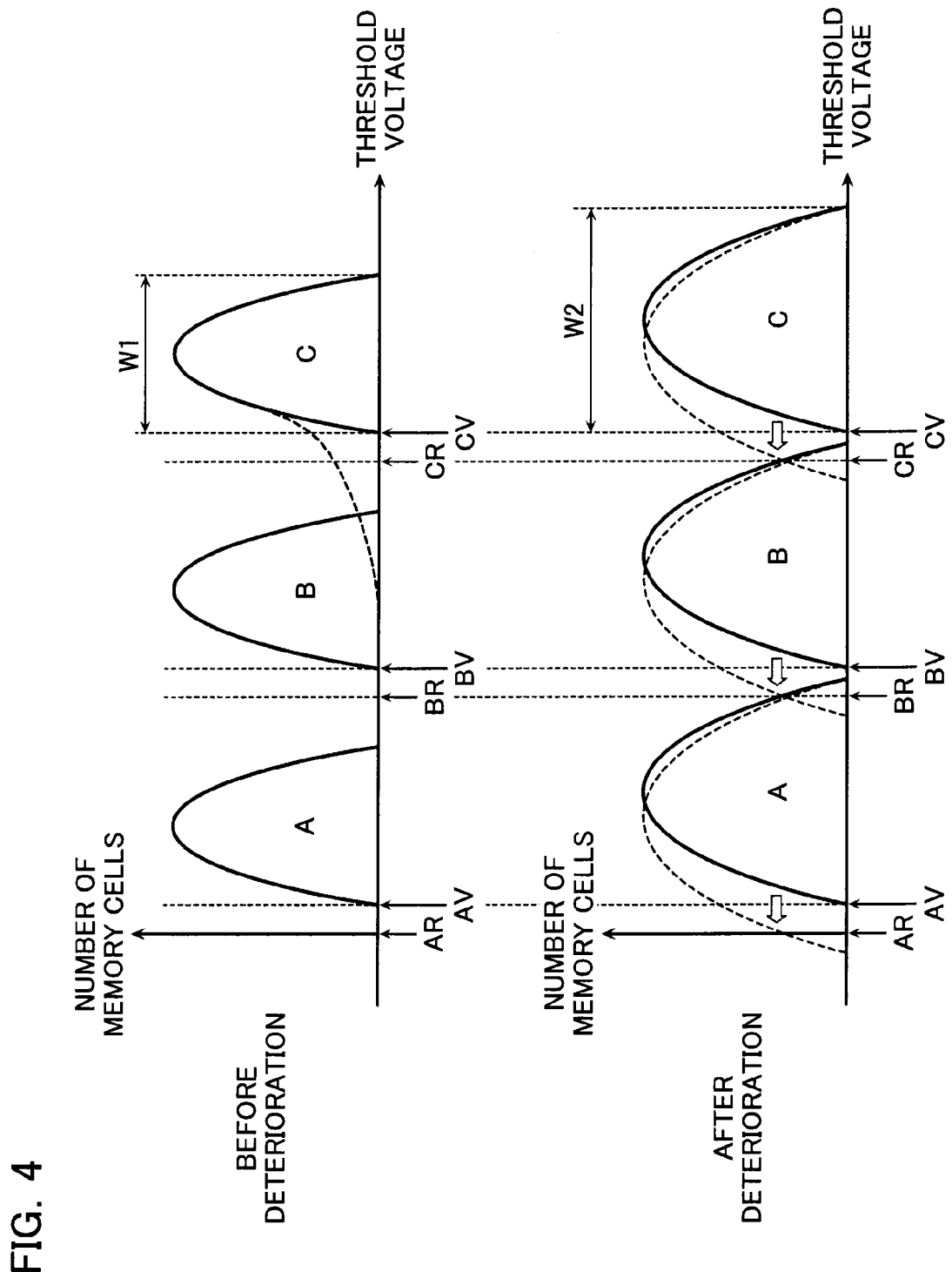
FIG. 4 is a diagram illustrating voltages during a read operation and a write verify operation according to a comparative example.

Next, problems when the read voltages (AR, BR, and CR) and the write verify voltages (AV, BV, and CV) are set to the same value will be described with reference to a comparative example. FIG. 4 illustrates the relation between threshold voltage distributions and voltages applied to the selected word line during a read operation and a write verify operation according to the comparative example. The upper part of FIG. 4 illustrates a state before the memory cell MC deteriorates and the lower part of FIG. 4 illustrates a state after the memory cell MC deteriorated due to the repetition of the write/erase operations for the memory cell MC. In the following description, simply, the former is referred to as "before deterioration" and the latter is referred to as "after deterioration".

In FIG. 4, a solid line indicates the threshold voltage distribution immediately after the write operation is completed, and a broken line indicates the threshold voltage distribution after a certain period of time elapses from the completion of the write operation. As illustrated in FIG. 4, when a certain period of time has elapsed from the write operation, charges go out of the floating gate electrode of the memory cell MC and the threshold voltage is reduced.

In the memory cell MC before deterioration, most of the charges are trapped by the floating gate electrode, and the threshold voltage increases as the number of charges trapped by the floating gate electrode increases. In this case, the number of charges that go out after a time has elapsed increases as the threshold voltage increases. Therefore, the largest dispersion occurs in the threshold voltage distribution C after the time elapses. On the other hand, there is little dispersion in the threshold voltage distributions A and B. The upper part of FIG. 4 illustrates a case in which there is no dispersion in the threshold voltage distributions A and B.

On the other hand, in the memory cell MC after deterioration, for example, there are a large number of charges trapped by a tunnel insulating film which has deteriorated. The number of charges emitted from the tunnel insulating film after a certain period of time elapses from the completion of the write operation may be regarded to be substantially constant, regardless of the threshold voltage distributions of the memory cell MC. Therefore, after the time elapses, dispersions in the threshold voltage distributions A, B, and C are substantially the same. After the time elapses from the write operation, there may be an overlap portion among the threshold voltage distributions A, B, and C after the deterioration of the memory cell MC.

In the read operation using the read voltages AR, BR, and CR, when reading data from the memory cell MC after deterioration, data can be read accurately. However, when reading data before deterioration, the read voltage CR is too large to read the threshold voltage distribution C changed after a time has elapsed and the possibility of a reading error occurring is high. In the read operation and the write verify operation, when the read voltages AR, BR, and CR and the write verify voltages AV, BV, and CV are set to the same value before and after the deterioration of the memory cell MC, there is a concern that an operation error will occur.

In order to solve the problem, the nonvolatile semiconductor memory device according to this embodiment performs the following read operation.

[Operation of Nonvolatile Semiconductor Memory Device According to First Embodiment]

Figure 5:
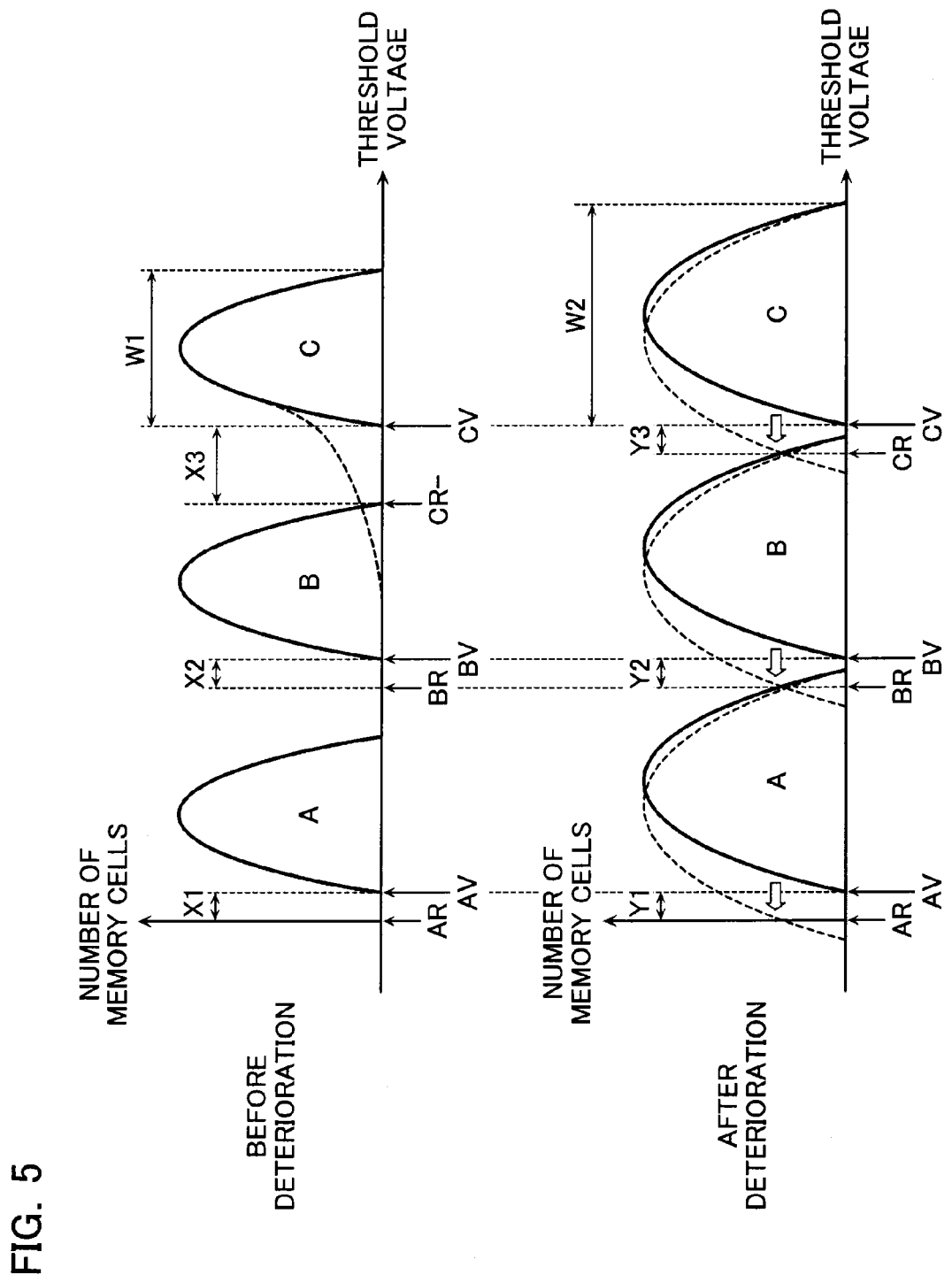
FIG. 5 is a diagram illustrating voltages during a read operation and a write verify operation according to a first embodiment.

FIG. 5 is a diagram illustrating the relation between the threshold voltage distributions and the voltages applied to the selected word line during the read operation and the write verify operation according to the first embodiment. In this embodiment, it is assumed that four-value data illustrated in FIG. 3 are stored in the memory cells MC. The upper part of FIG. 5 illustrates a state before the memory cell MC deteriorates and the lower part thereof illustrates a state after the memory cell MC has deteriorated. In FIG. 5, a solid line indicates the threshold voltage distribution immediately after the write operation is completed, and a broken line indicates the threshold voltage distribution after a certain period of time has elapsed from the write operation.

As illustrated in FIG. 5, the read operation according to the first embodiment differs from that according to the comparative example in that, among the read voltages applied to the memory cell MC before deterioration, the read voltage between the threshold voltage distribution B and the threshold voltage distribution C is a read voltage $CR^-$ ($CR^-<CR$). In the example illustrated in FIG. 5, the read voltages (AR, BR, and CR) and the write verify voltages (AV, BV, and CV) other than the read voltage $CR^-$ are set to the same values as those in the comparative example illustrated in FIG. 4.

As a result, a difference X3 between the read voltage $CR^-$ and the write verify voltage CV before deterioration is set to be more than a difference Y3 between the read voltage CR and the write verify voltage CV after deterioration (Y3<X3). A difference X1 between the read voltage AR and the write verify voltage AV before deterioration is equal to a difference Y1 between the read voltage AR and the write verify voltage AV after deterioration (X1=Y1). A difference X2 between the read voltage BR and the write verify voltage BV before deterioration is equal to a difference Y2 between the read voltage BR and the write verify voltage BV after deterioration (X2=Y2).

In the example illustrated in FIG. 5, the difference between the minimum value AR of the read voltage and the maximum value CV of the write verify voltage before deterioration is equal to the difference between the minimum value AR of the read voltage and the maximum value CV of the write verify voltage after deterioration.

In FIG. 5, before deterioration, the differences X1, X2, and X3 between the read voltages and the write verify voltages are set so as to satisfy the relation X1=X2<X3. However, the differences X1, X2, and X3 may be set so as to satisfy the relation X1≤X2<X3. In addition, in FIG. 5, after deterioration, the differences Y1, Y2, and Y3 between the read voltages and the write verify voltages are set so as to satisfy the relation Y1=Y2=Y3. However, the differences Y1, Y2, and Y3 may be set so as to satisfy the relation Y1≤Y2≤Y3.

[Effect]

In the operation according to this embodiment, the difference X3 between the read voltage $CR^-$ and the write verify voltage CV before deterioration is more than the difference Y3 between the read voltage CR and the write verify voltage CV after deterioration. Therefore, when the read operation is performed before the memory cell MC deteriorates, an error can be reduced in the read operation of the memory cell MC whose threshold voltage varies through a certain time. Since the read voltage varies before and after the memory cell MC deteriorates, the read operation suitable for the state of the memory cell MC may be performed. As a result, an error in the read operation due to the deterioration of the memory cell MC may be prevented.

Second Embodiment

Next, a nonvolatile semiconductor memory device according to a second embodiment will be described with reference to FIG. 6. The entire configuration of the nonvolatile semiconductor memory device according to this embodiment is the same as that of the nonvolatile semiconductor memory device according to the first embodiment and the detailed description thereof will be omitted. In addition, in this embodiment, components having the same configurations as those in the first embodiment are denoted by the same reference numerals and the redundant description thereof will be omitted.

Figure 6:
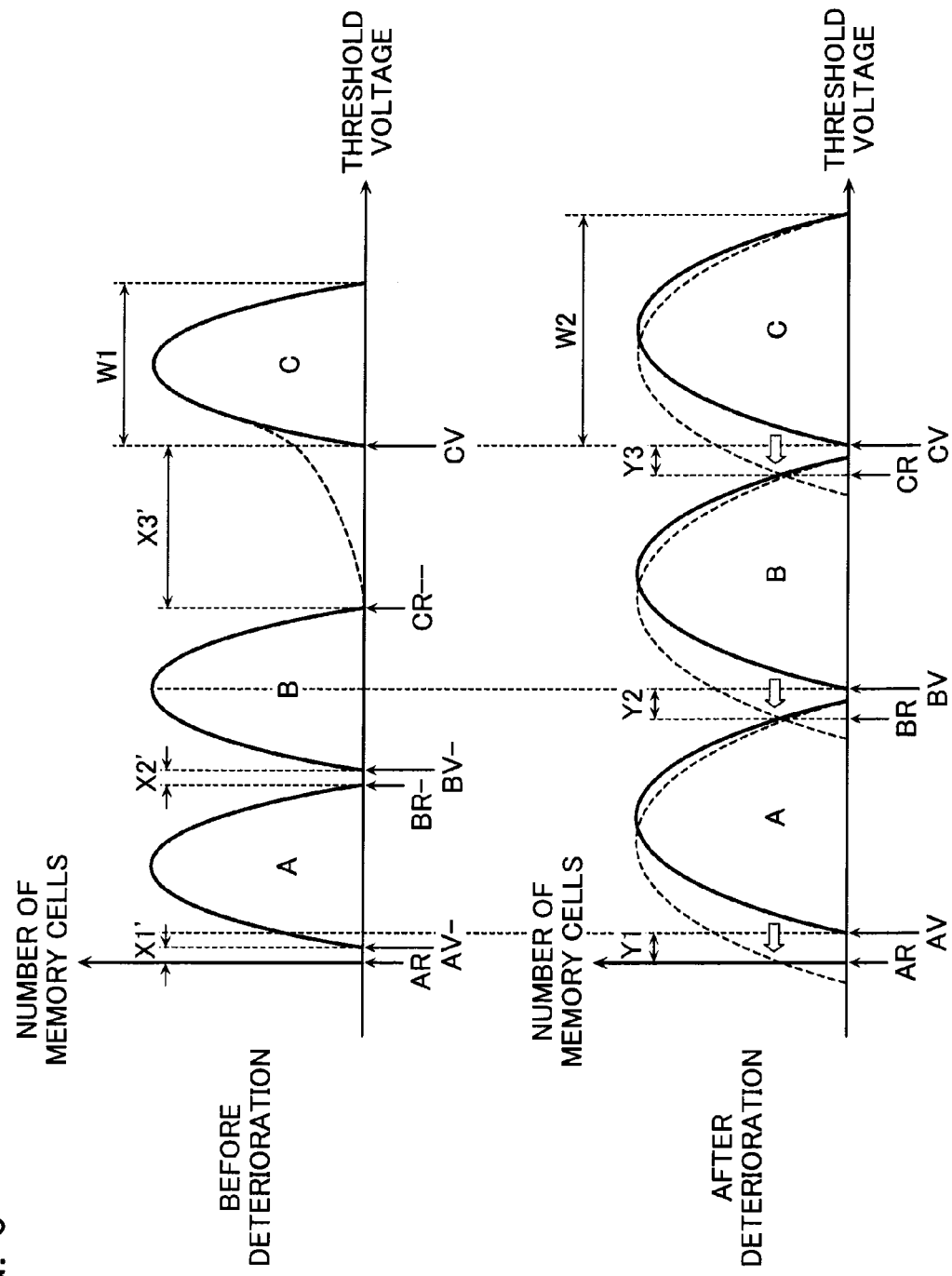
FIG. 6 is a diagram illustrating voltages during a read operation and a write verify operation according to a second embodiment.

FIG. 6 is a diagram illustrating the relation between threshold voltage distributions and voltages applied to a selected word line during a read operation and a write verify operation according to the second embodiment. In this embodiment, it is assumed that four-value data illustrated in FIG. 3 are stored in the memory cells MC. In addition, the upper part of FIG. 6 illustrates a state before the memory cell MC deteriorates and the lower part of FIG. 6 illustrates a state after the memory cell MC has deteriorated. In FIG. 6, a solid line indicates a threshold voltage distribution immediately after the write operation is completed and a broken line indicates a threshold voltage distribution after a certain period of time has elapsed from the write operation.

[Operation of Nonvolatile Semiconductor Memory Device According to Second Embodiment]

In the first embodiment, an example is described in which the read voltages ($CR^-$ and CR) when data is read from the distribution C with the maximum threshold voltage are changed during the data read operation before and after deterioration.

However, in the second embodiment, as illustrated in FIG. 6, in the write verify operation for the memory cell MC before deterioration, the write verify voltages when the threshold voltage distributions A and B are written are write verify voltages $AV^-$ and $BV^-$ ($AV^-<AV$ and $BV^-<BV$). In addition, in the read operation according to this embodiment, among the read voltages applied to the memory cell MC before deterioration, the read voltage between the threshold voltage distribution B and the threshold voltage distribution C is a read voltage $CR^{--}$ ($CR^{--}<CR$). Among the read voltages applied to the memory cell MC before deterioration, the read voltage between the threshold voltage distribution A and the threshold voltage distribution B is a read voltage $BR^-$ ($BR^-<BR$).

As a result, a difference X3' between the read voltage $CR^{--}$ and the write verify voltage CV before deterioration is set to be more than the difference Y3 between the read voltage CR and the write verify voltage CV after deterioration (Y3<X3'). In this embodiment, a difference X1' between the read voltage AR and the write verify voltage $AV^-$ before deterioration is set to be less than the difference Y1 between the read voltage AR and the write verify voltage AV after deterioration (X1'<Y1). In addition, a difference X2' between the read voltage $BR^-$ and the write verify voltage $BV^-$ before deterioration is set to be less than the difference Y2 between the read voltage BR and the write verify voltage BV after deterioration (X2'<Y2).

In the example illustrated in FIG. 6, the difference between the minimum value AR of the read voltage and the maximum value CV of the write verify voltage before deterioration is equal to the difference between the minimum value AR of the read voltage and the maximum value CV of the write verify voltage after deterioration.

In FIG. 6, before deterioration, the differences X1', X2', and X3' between the read voltages and the write verify voltages are set to satisfy the relation X1'=X2'<X3'. However, the differences X1', X2', and X3' may be set so as to satisfy the relation X1'≤X2'<X3'. In addition, in FIG. 6, after deterioration, the differences Y1, Y2, and Y3 between the read voltages and the write verify voltages are set so as to satisfy the relation Y1=Y2=Y3. However, the differences Y1, Y2, and Y3 may be set so as to satisfy the relation Y1≤Y2≤Y3.

[Effect]

In the operation according to this embodiment, the difference X3' between the read voltage $CR^{--}$ and the write verify voltage CV before deterioration is more than the difference Y3 between the read voltage CR and the write verify voltage CV after deterioration. Therefore, when the read operation is performed before the memory cell MC deteriorates, an error can be reduced in the read operation of the memory cell MC whose threshold voltage varies through a certain time. In this embodiment, the value of the read voltage $CR^{--}$ is set to include a large number of memory cells MC whose threshold voltages vary through a certain time. Therefore, the read operation may be performed with high accuracy, compared to the first embodiment.

Before the memory cell MC deteriorates, dispersion in the threshold voltage distribution through the time is small in the memory cell MC to which data corresponding to the threshold voltage distributions A and B is written. Therefore, even when the write verify voltage is set such that the gap between the threshold voltage distribution A and the threshold voltage distribution B is reduced, no error occurs in the read operation. Since the read voltage and the write verify voltage vary before and after the memory cell MC deteriorates, a read operation and a write verify operation suitable for the state of the memory cell MC may be performed. As a result, an error in the read operation due to the deterioration of the memory cell MC may be prevented.

Third Embodiment

Next, a nonvolatile semiconductor memory device according to a third embodiment will be described with reference to FIGS. 7 and 8. The entire configuration of the nonvolatile semiconductor memory device according to this embodiment is the same as that of the nonvolatile semiconductor memory device according to the first embodiment and the detailed description thereof will be omitted. In addition, in this embodiment, components having the same configurations as those in the first embodiment are denoted by the same reference numerals and the redundant description thereof will be omitted.

Figure 7:
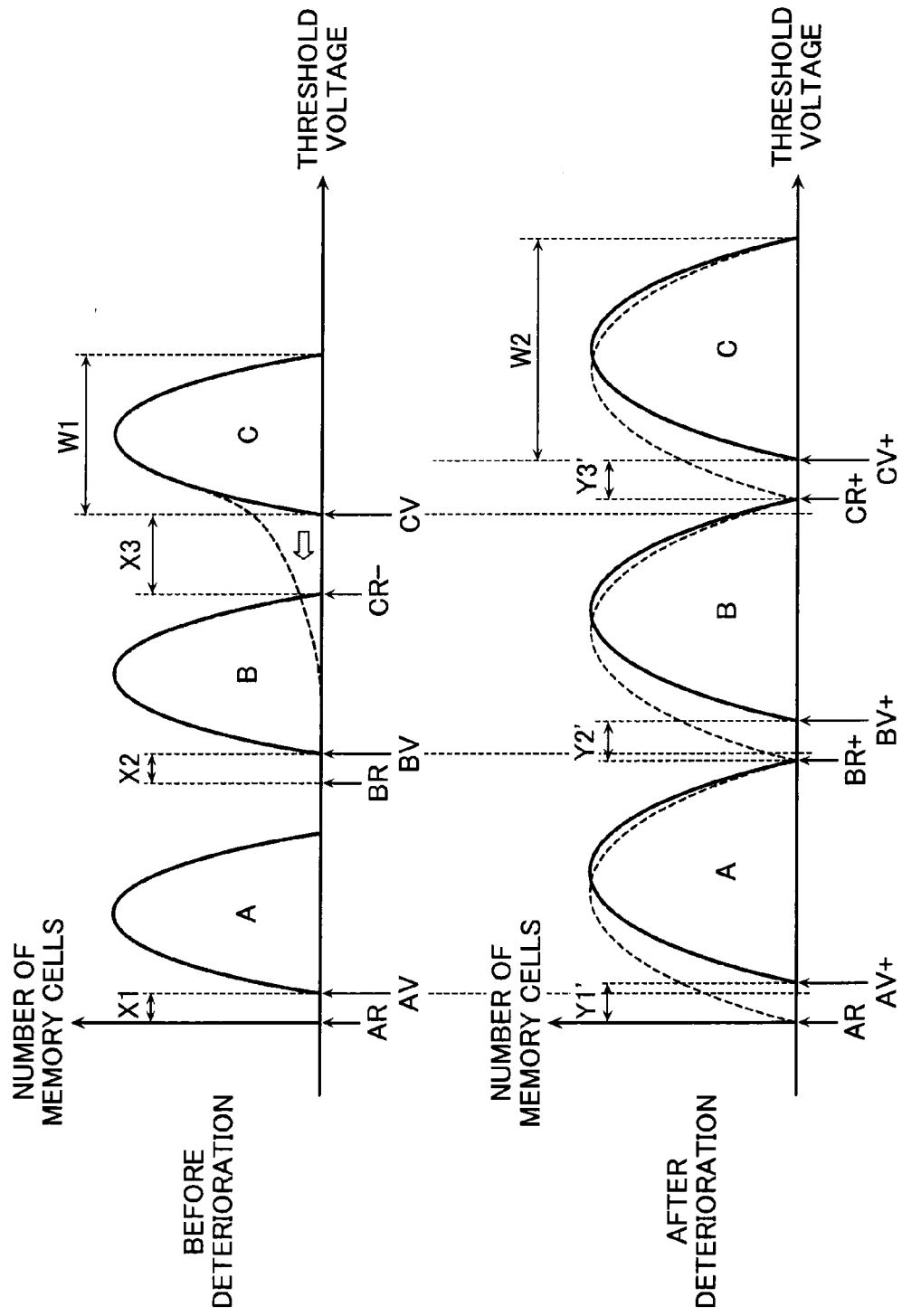
FIG. 7 is a diagram illustrating voltages during a read operation and a write verify operation according to a third embodiment.
Figure 8:
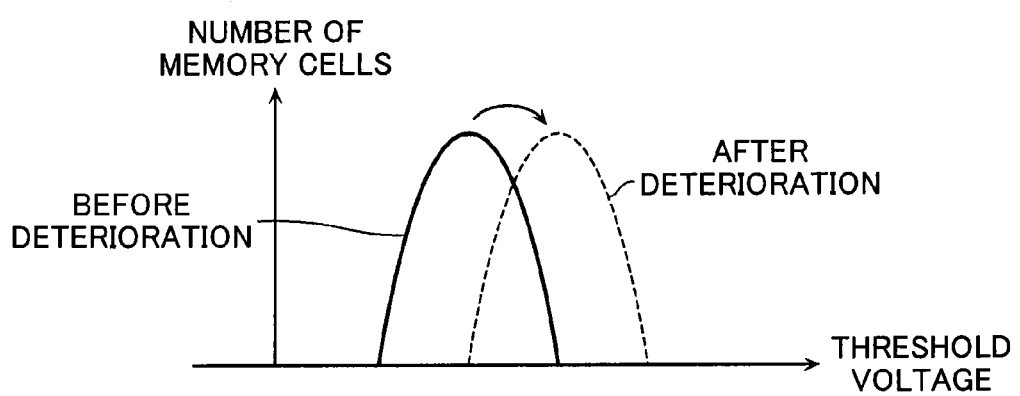
FIG. 8 is a diagram illustrating a variation in a neutral threshold voltage before and after a memory cell deteriorates.

FIG. 7 is a diagram illustrating the relation between threshold voltage distributions and voltages applied to a selected word line during a read operation and a write verify operation according to the third embodiment. In this embodiment, it is assumed that four-value data illustrated in FIG. 3 are stored in the memory cells MC. In addition, the upper part of FIG. 7 illustrates a state before the memory cell MC deteriorates and the lower part of FIG. 7 illustrates a state after the memory cell MC has deteriorated. In FIG. 7, a solid line indicates a threshold voltage distribution immediately after the write operation is completed and a broken line indicates a threshold voltage distribution after a certain period of time has elapsed from the write operation.

[Operation of Nonvolatile Semiconductor Memory Device According to Third Embodiment]

In the first and second embodiments, the read voltage and the write verify voltage applied to the memory cell MC before deterioration are changed.

However, in the example illustrated in FIG. 7, in the write verify operation for the memory cell MC after deterioration, the write verify voltages when the threshold voltage distributions A, B, and C are written are write verify voltages $AV^+$, $BV^+$, and $CV^+$ ($AV<AV^+$, $BV<BV^+$, $CV<CV^+$). The reason why the write verify voltages $AV^+$, $BV^+$, and $CV^+$ applied to the memory cell MC after deterioration may be increased to move the threshold voltage distributions in the positive direction will be described below.

In the read operation according to this embodiment, among the read voltages applied to the memory cell MC after deterioration, the read voltage between the threshold voltage distribution A and the threshold voltage distribution B is a read voltage $BR^+$ ($BR<BR^+$). Among the read voltages applied to the memory cell MC before and after deterioration, the read voltages between the threshold voltage distribution B and the threshold voltage distribution C are read voltages $CR^-$ and $CR^+$ ($CR^-<CR^+$), respectively.

In this embodiment, the difference X3 between the read voltage $CR^-$ and the write verify voltage CV before deterioration is set to be more than the difference Y3' between the read voltage $CR^+$ and the write verify voltage $CV^+$ after deterioration (Y3'<X3). In addition, the difference X1 between the read voltage AR and the write verify voltage AV before deterioration is set to be less than the difference Y1' between the read voltage $AR^+$ and the write verify voltage $AV^+$ after deterioration (X1<Y1'). The difference X2 between the read voltage BR and the write verify voltage BV before deterioration is set to be less than the difference Y2' between the read voltage $BR^+$ and the write verify voltage $BV^+$ after deterioration (X2<Y2').

In the example illustrated in FIG. 7, the difference between the minimum value AR of the read voltage and the maximum value CV of the write verify voltage before deterioration is less than the difference between the minimum value AR of the read voltage and the maximum value $CV^+$ of the write verify voltage after deterioration.

In FIG. 7, before deterioration, the differences X1, X2, and X3 between the read voltages and the write verify voltages are set so as to satisfy the relation X1=X2<X3. However, the difference X1, X2, and X3 may be set so as to satisfy the relation X1≤X2<X3. In addition, in FIG. 7, after deterioration, the differences Y1', Y2', and Y3' between the read voltages and the write verify voltages are set so as to satisfy the relation Y1'=Y2'=Y3'. However, the difference Y1', Y2', and Y3' may be set so as to satisfy the relation Y1'≤Y2'≤Y3'.

Next, the reason why the threshold voltage distribution of the memory cell MC after deterioration can be moved in the positive direction will be described with reference to FIG. 8. FIG. 8 is a diagram illustrating a variation in the neutral threshold voltage of the memory cell MC before and after deterioration. The neutral threshold voltage means a threshold voltage held by the memory cell MC when a certain operation (for example, an erase operation) is performed on the memory cell MC.

When the write/erase operations are repeatedly performed on the memory cell MC, the tunnel insulating film deteriorates and charge is likely to be trapped therein. Therefore, the threshold voltage of the deteriorated memory cell MC is likely to increase (data is likely to be written). On the other hand, since charge is trapped by the tunnel insulating film during the erase operation, the threshold voltage of the deteriorated memory cell MC is less likely to be reduced. Therefore, even when a certain operation (for example, an erase operation) is performed on the memory cell MC before and after deterioration under the same conditions, the held threshold voltage (neutral threshold voltage) value of the memory cell MC after deterioration is more than that of the memory cell MC before deterioration. Therefore, as illustrated in FIG. 8, the distribution of the neutral threshold voltage of the memory cell MC after deterioration is moved in the positive direction, as compared to the distribution of the neutral threshold voltage of the memory cell MC before deterioration.

When the neutral threshold voltage is changed, it is possible to increase the write verify voltage applied to the memory cell MC after deterioration with the change in the neutral threshold voltage. When the memory cell MC before deterioration is set to have high threshold voltage distributions, it is necessary to increase the value of the write voltage applied to the selected memory cell MC during the write operation. This accelerates the deterioration of the memory cell MC and it is not preferable. However, in the memory cell MC after deterioration, the neutral threshold voltage as an operation standard increases. Therefore, the write operation may be reliably performed without increasing the write voltage applied to the selected memory cell MC. As a result, as illustrated in FIG. 7, the write verify voltages $AV^+$, $BV^+$, and $CV^+$ may be set to be more than the write verify voltages AV, BV, and CV.

[Effect]

In the operation according to this embodiment, the difference X3 between the read voltage $CR^-$ and the write verify voltage CV before deterioration is more than the difference Y3' between the read voltage $CR^+$ and the write verify voltage $CV^+$ after deterioration. Therefore, when the read operation is performed before the memory cell MC deteriorates, an error may be reduced in the read operation of the memory cell MC whose threshold voltage varies through a certain time.

After the memory cell MC deteriorates, the write verify voltages $VA^+$, $VB^+$, and $VC^+$ are used to write the threshold voltage distributions A, B, and C. In this case, after the memory cell MC deteriorates, the gap between the threshold voltage distributions A, B, and C may be increased. Therefore, even when the threshold voltage distributions are changed through the time, the threshold voltage distributions do not overlap each other. As a result, the read operation using the read voltages AR, $BR^+$, and $CR^+$ may be performed accurately. Since the read voltage and the write verify voltage are changed before and after the memory cell MC deteriorates, the read operation and the write verify operation suitable for the state of the memory cell MC may be performed. As a result, an error in the read operation due to the deterioration of the memory cell MC may be prevented.

Fourth Embodiment

Next, a nonvolatile semiconductor memory device according to a fourth embodiment will be described with reference to FIG. 9. The entire configuration of the nonvolatile semiconductor memory device according to this embodiment is the same as that of the nonvolatile semiconductor memory device according to the first embodiment and the detailed description thereof will be omitted. In addition, in this embodiment, components having the same configurations as those in the first embodiment are denoted by the same reference numerals and the redundant description thereof will be omitted.

Figure 9:
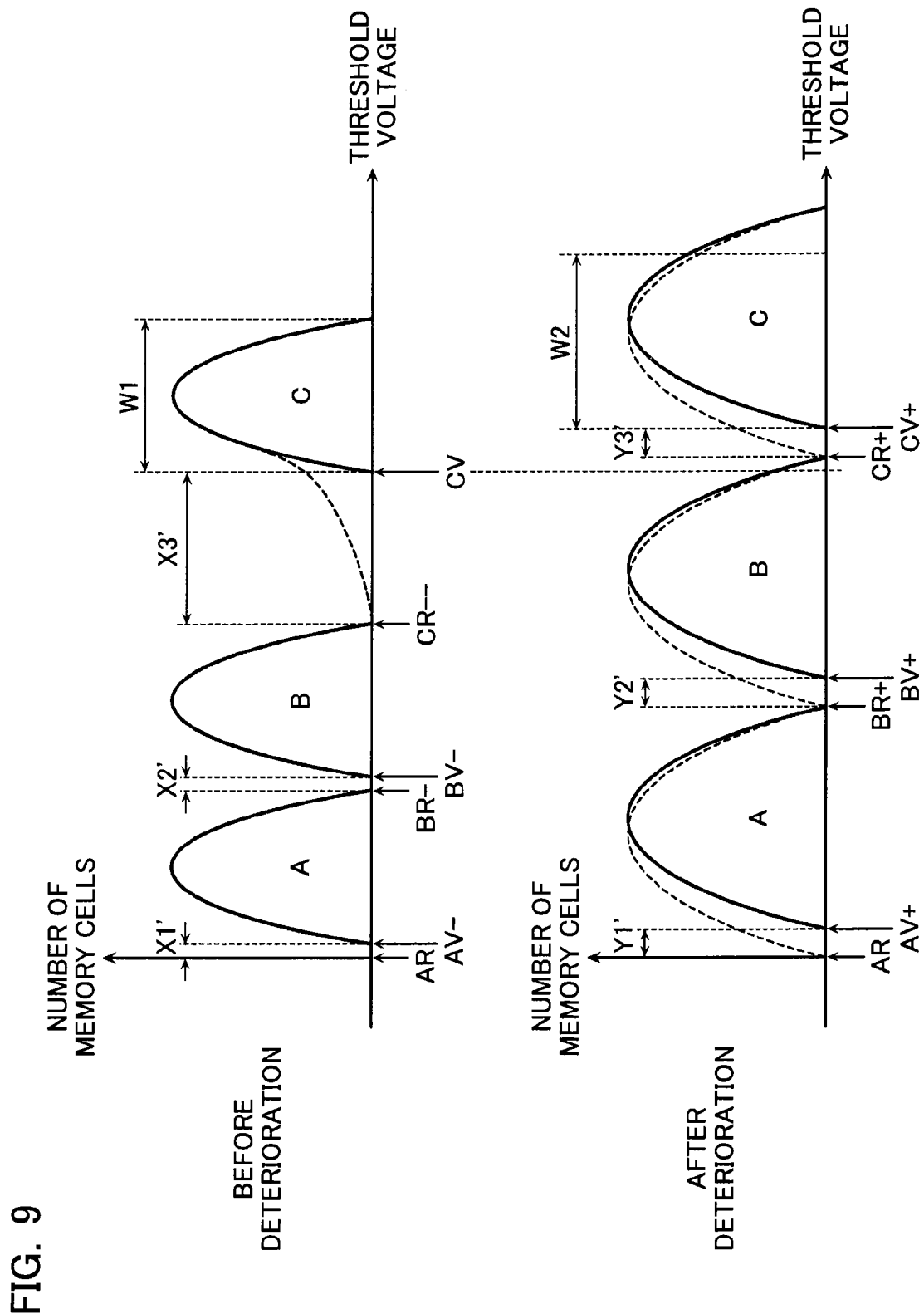
FIG. 9 is a diagram illustrating voltages during a read operation and a write verify operation according to a fourth embodiment.

FIG. 9 is a diagram illustrating the relation between threshold voltage distributions and voltages applied to a selected word line during a read operation and a write verify operation according to the fourth embodiment. In this embodiment, it is assumed that four-value data illustrated in FIG. 3 are stored in the memory cells MC. In addition, the upper part of FIG. 9 illustrates a state before the memory cell MC deteriorates and the lower part of FIG. 9 illustrates a state after the memory cell MC has deteriorated. In FIG. 9, a solid line indicates a threshold voltage distribution immediately after the write operation is completed and a broken line indicates a threshold voltage distribution after a certain period of time has elapsed from the write operation.

[Operation of Nonvolatile Semiconductor Memory Device According to Fourth Embodiment]

As illustrated in FIG. 9, in the write verify operation for the memory cell MC before deterioration, the write verify voltages when the threshold voltage distributions A and B are written are write verify voltages $AV^-$ and $BV^-$, respectively. In addition, in the write verify operation for the memory cell MC after deterioration, the write verify voltages when the threshold voltage distributions A, B, and C are written are write verify voltages $AV^+$, $BV^+$, and $CV^+$ ($AV^-<AV^+$, $BV^-<BV^+$, and $CV<CV^+$), respectively.

In the read operation according to this embodiment, among the read voltages applied to the memory cell MC before deterioration, the read voltage between the threshold voltage distribution B and the threshold voltage distribution C is a read voltage $CR^{--}$. Among the read voltages applied to the memory cell MC before deterioration, the read voltage between the threshold voltage distribution A and the threshold voltage distribution B is a read voltage $BR^-$. In addition, in the read operation according to this embodiment, among the read voltages applied to the memory cell MC after deterioration, the read voltage between the threshold voltage distribution A and the threshold voltage distribution B is a read voltage $BR^+$ ($BR^-<BR^+$). Among the read voltages applied to the memory cell MC after deterioration, the read voltage between the threshold voltage distribution B and the threshold voltage distribution C is a read voltage $CR^+$ ($CR^{--}<CR^+$).

In this embodiment, the difference X3' between the read voltage $CR^{--}$ and the write verify voltage CV before deterioration is set so as to be more than the difference Y3' between the read voltage $CR^+$ and the write verify voltage $CV^+$ after deterioration (Y3'<X3'). In addition, the difference X1' between the read voltage AR and the write verify voltage $AV^-$ before deterioration is set to be less than the difference Y1' between the read voltage AR and the write verify voltage $AV^+$ after deterioration (X1'<Y1'). The difference X2' between the read voltage $BR^-$ and the write verify voltage $BV^-$ before deterioration is set so as to be less than the difference Y2' between the read voltage $BR^+$ and the write verify voltage $BV^+$ after deterioration (X2'<Y2').

In the example illustrated in FIG. 9, the difference between the minimum value AR of the read voltage and the maximum value CV of the write verify voltage before deterioration is less than the difference between the minimum value AR of the read voltage and the maximum value $CV^+$ of the write verify voltage after deterioration.

In FIG. 9, before deterioration, the differences X1', X2', and X3' between the read voltages and the write verify voltages are set so as to satisfy the relation X1'=X2'<X3'. However, the differences X1', X2', and X3' may be set so as to satisfy the relation X1'≤X2'<X3'. In addition, in FIG. 9, after deterioration, the differences Y1', Y2', and Y3' between the read voltages and the write verify voltages are set so as to satisfy the relation Y1'=Y2'=Y3'. However, the differences Y1', Y2', and Y3' may be set so as to satisfy the relation Y1'≤Y2'≤Y3'.

[Effect]

In the operation according to this embodiment, the difference X3' between the read voltage $CR^{--}$ and the write verify voltage CV before deterioration is more than the difference Y3' between the read voltage $CR^+$ and the write verify voltage $CV^+$ after deterioration. Therefore, when the read operation is performed before the memory cell MC deteriorates, an error may be reduced in the read operation of the memory cell MC whose threshold voltage varies through a certain time. In this embodiment, the value of the read voltage $CR^{--}$ is set to include a large number of memory cells MC whose threshold voltages vary through a certain time. Therefore, an accurate read operation may be performed.

After the memory cell MC deteriorates, the write verify voltages $VA^+$, $VB^+$, and $VC^+$ are used to write the threshold voltage distributions A, B, and C. In this case, even after the memory cell MC deteriorates, the gap between the threshold voltage distributions A, B, and C may be increased. Therefore, even when the threshold voltage distributions are changed through the time, the threshold voltage distributions do not overlap each other. As a result, the read operation using the read voltages AR, $BR^+$, and $CR^+$ may be performed accurately. Since the read voltage and the write verify voltage are changed before and after the memory cell MC deteriorates, the read operation and the write verify operation suitable for the state of the memory cell MC may be performed. As a result, an error may be prevented in the read operation due to the deterioration of the memory cell MC.

The nonvolatile semiconductor memory devices according to the embodiments of the invention is described above. In the nonvolatile semiconductor memory devices, before and after the memory cell MC deteriorates, the read voltage and the write verify voltage applied to the selected word line are changed. The control circuit 7 may be used to determine the deteriorating state of the characteristics of the memory cell MC, that is, whether the characteristics of the memory cell MC deteriorate. Next, an example of the operation of the control circuit 7 determining the deteriorating state of the memory cell MC will be described. The following determining operation may be applied to any one of the above-described embodiments.

[Determining Operation 1 of Control Circuit 7]

Figure 10:
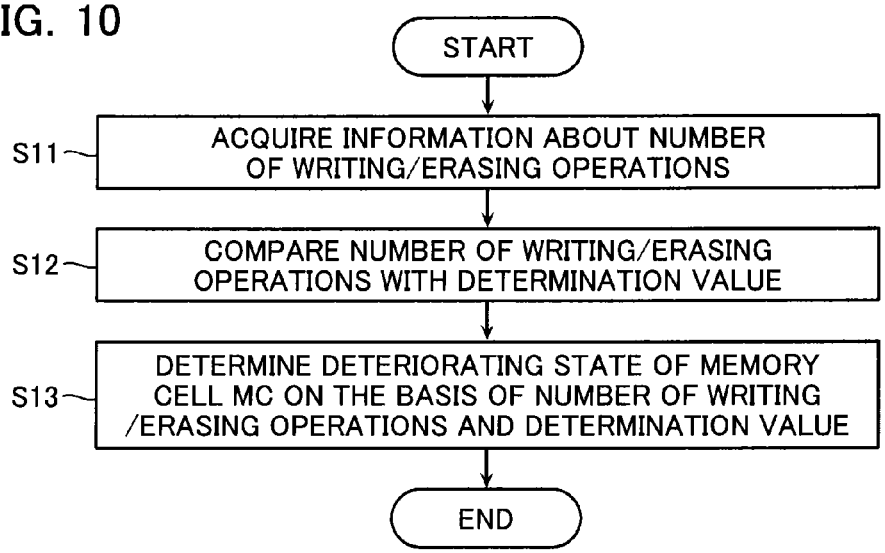
FIG. 10 is a flowchart illustrating the determination of the deteriorating state of the memory cell by a control circuit.

FIG. 10 is a flowchart illustrating the operation of the control circuit 7 of the nonvolatile semiconductor memory device according to each of the above-described embodiments. FIG. 10 is a diagram illustrating a case in which the control circuit 7 performs the determining operation on the basis of the number of write/erase operations for the nonvolatile semiconductor memory device.

In this case, when the write/erase operations are performed on the nonvolatile semiconductor memory device, information indicating that the write/erase operations are performed is transmitted to the control circuit 7. The control circuit 7 stores the number of write/erase operations performed on the nonvolatile semiconductor memory device on the basis of the information. The control circuit 7 may determine the deteriorating state of the memory cell MC on the basis of the number of write/erase operations performed on the nonvolatile semiconductor memory device. Next, the operation will be described with reference to FIG. 10.

When the determining operation of the control circuit 7 starts, the control circuit 7 acquires information about the number of write/erase operations performed on the nonvolatile semiconductor memory device from the internal storage area (Step S11). The control circuit 7 compares the number of write/erase operations performed on the nonvolatile semiconductor memory device with a certain determination value (Step S12).

In the memory cell MC, when the write/erase operations of the nonvolatile semiconductor memory device are repeatedly performed, the tunnel insulating film deteriorates. The control circuit 7 determines the deteriorating state of the memory cell MC on the basis of the number of write/erase operations of the nonvolatile semiconductor memory device and the determination value (Step S13).

For example, when the number of write/erase operations performed on the nonvolatile semiconductor memory device is more than a certain value, the control circuit 7 determines that the memory cell MC deteriorates. On the other hand, when the number of write/erase operations performed on the nonvolatile semiconductor memory device is equal to or less than the certain value, the control circuit 7 determines that the memory cell MC does not deteriorate. The voltage applying operation of the above-described embodiments is performed on the basis of the determination result of the control circuit 7.

[Determination Operation 2 of Control Circuit 7]

Figure 11:
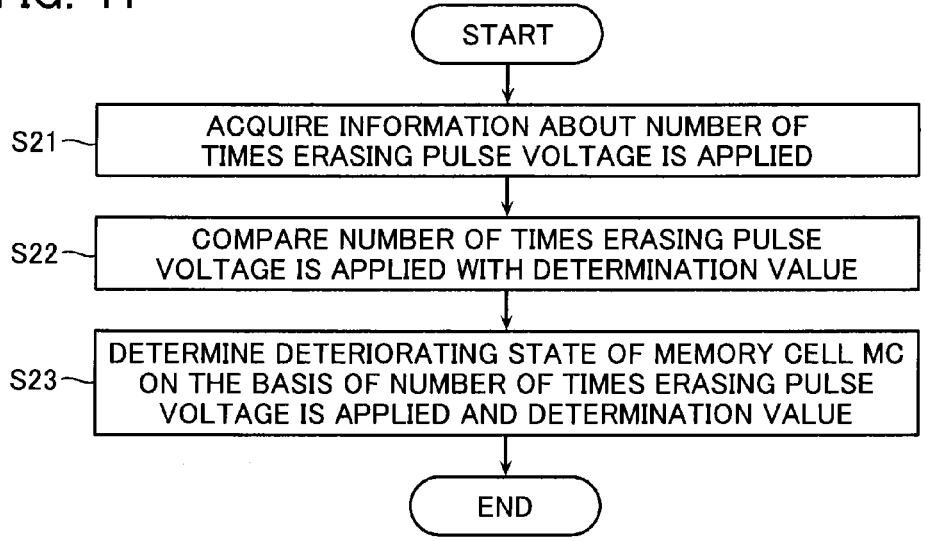
FIG. 11 is a flowchart illustrating the determination of the deteriorating state of the memory cell by the control circuit.

FIG. 11 is a flowchart illustrating the operation of the control circuit 7 of the nonvolatile semiconductor memory device according to this embodiment. FIG. 11 is a diagram illustrating a case in which the control circuit 7 performs a determining operation on the basis of the number of times the erase pulse voltage is applied when an erase operation is performed on the nonvolatile semiconductor memory device.

The erase operation of the nonvolatile semiconductor memory device according to the above-mentioned embodiments sets the control gate voltage of the memory cell MC to 0 V and applies a high erase pulse voltage to a well on which the memory cells MC are formed. Then, electrons are emitted from the floating gate electrode to a semiconductor substrate through the tunnel insulating film and the threshold voltage of the memory cell MC is shifted in the negative direction. The erase pulse voltage is applied plural times while the voltage value increases.

Figure 12:
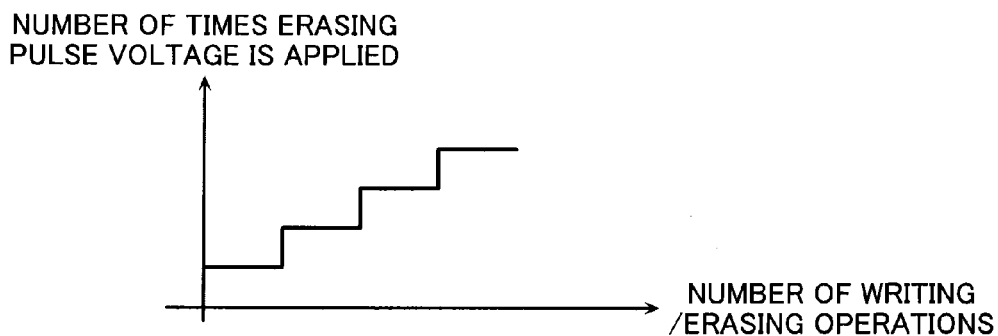
FIG. 12 is a diagram illustrating the number of times an erase pulse voltage is applied during an erase operation.

In the memory cell MC, when the operation of the nonvolatile semiconductor memory device is repeatedly performed, the tunnel insulating film deteriorates. In the memory cell MC, when the tunnel insulating film deteriorates, the speed of the erase operation for emitting electrons from the floating gate electrode is reduced. Therefore, as illustrated in FIG. 12, when the write/erase operations for the memory cell MC are repeated, the number of times of the erase pulse application required for the erase operation increases. The control circuit 7 stores the number of times the erase pulse voltage is applied. The control circuit 7 may determine the deteriorating state of the memory cell MC on the basis of the number of times the erase pulse voltage is applied. This will be described with reference to FIG. 11.

When the determining operation of the control circuit 7 starts, the control circuit 7 acquires information about the number of times the erase pulse voltage is applied when the eras operation is performed on the nonvolatile semiconductor memory device from the internal storage area (Step S21). The control circuit 7 compares the number of times the erase pulse voltage is applied to the nonvolatile semiconductor memory device with a certain determination value (Step S22).

The control circuit determines the state of the memory cell MC on the basis of the determination value and the number of times of the erase pulse voltage application during the erase operation (Step S23). For example, when the number of times of the erase pulse voltage application during the erase operation is more than the certain value, the control circuit 7 determines that the memory cell MC deteriorates. On the other hand, when the number of times of the erase pulse voltage application during the erase operation is equal to or less than the certain value, the control circuit 7 determines that the memory cell MC does not deteriorate. The voltage applying operation of the above-described embodiments is performed on the basis of the determination result of the control circuit 7.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above-described embodiments, the nonvolatile semiconductor device of the four-value data storage type (2 bit/cell) is described above, but the invention is not limited thereto. The invention can be applied to a multi-bit storage type, such as an eight-value data storage type. Next, an example in which the first embodiment is applied to the nonvolatile semiconductor memory device of the eight-value data storage type will be described with reference to FIG. 13.

[Operation of Nonvolatile Semiconductor Memory Device According to Another Embodiment]

Figure 13:
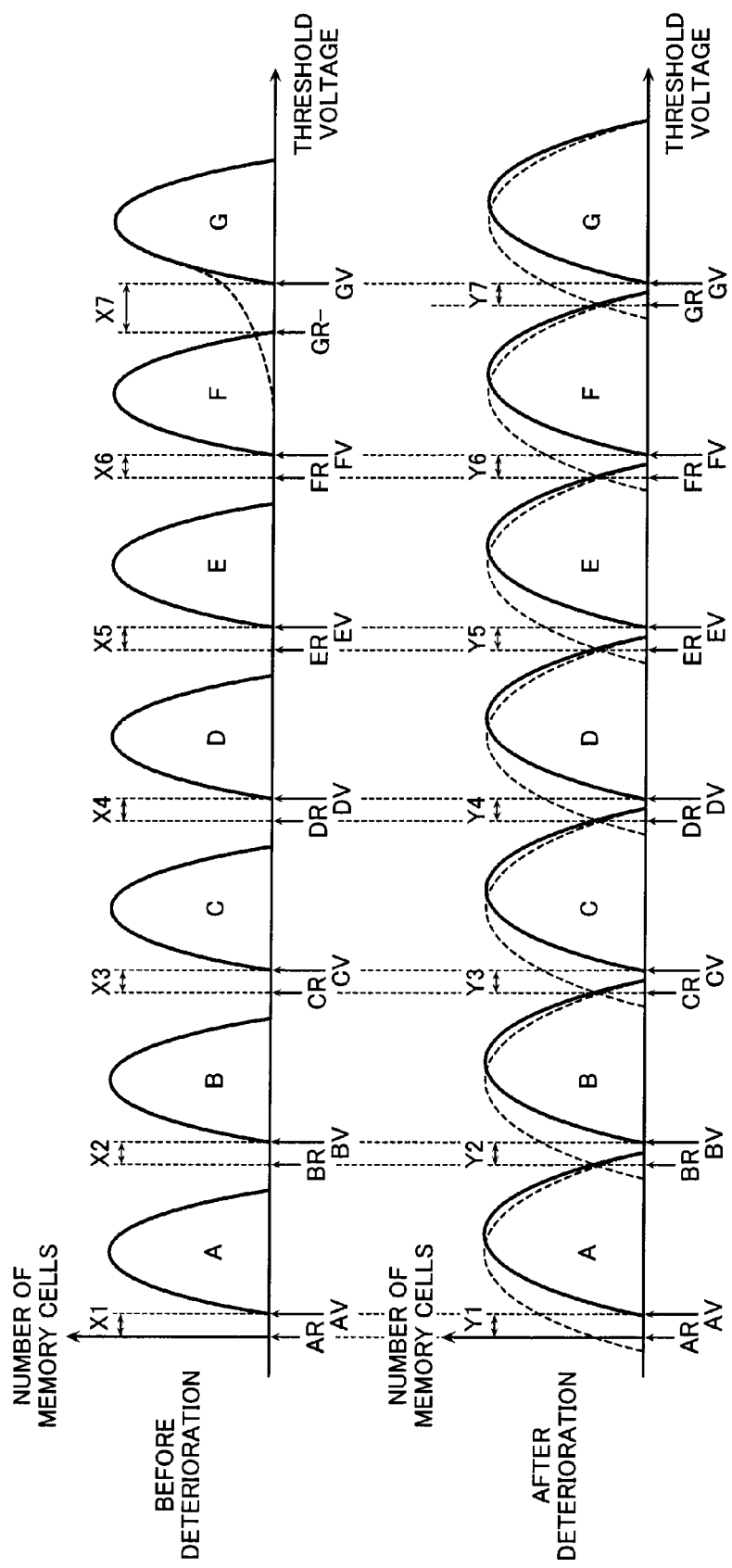
FIG. 13 is a diagram illustrating voltages during a read operation and a write verify operation according to another example.

FIG. 13 is a diagram illustrating the relation between threshold voltage distributions and voltages applied to a selected word line during a read operation and a write verify operation according to another embodiment. In this embodiment, it is assumed that eight-value data are stored in the memory cells MC. In this case, threshold voltage distributions A to G corresponding to the data are formed. In FIG. 13, a threshold voltage distribution in an erased state is omitted.

As illustrated in FIG. 13, in the write verify operation for the memory cell MC before deterioration according to this embodiment, the write verify voltages when the threshold voltage distributions A to G are written are write verify voltages AV to GV, respectively. In the read operation according to this embodiment, among the read voltages applied to the memory cell MC before deterioration, the read voltage between the threshold voltage distribution F and the threshold voltage distribution G is a read voltage $GR^-$.

In the example illustrated in FIG. 13, in the write verify operation for the memory cell MC after deterioration, the write verify voltages when the threshold voltage distributions A to G are written are write verify voltages AV to GV, respectively. In the read operation according to this embodiment, the read voltages applied to the memory cell MC after deterioration are read voltages AR to GR. As a result, a difference X7 between the read voltage $CR^-$ and the write verify voltage CV before deterioration is set to be more than a difference Y7 between the read voltage CR and the write verify voltage CV after deterioration (Y7<X7).

In FIG. 13, before deterioration, the differences X1 to X7 between the read voltages and the write verify voltages are set so as to satisfy the relation X1=X2=X3=X4=X5=X6<X7. However, the differences X1 to X7 may be set so as to satisfy the relation X1≤X2≤X3≤X4≤X5≤X6<X7. In addition, in FIG. 13, after deterioration, the differences Y1 to Y7 between the read voltages and the write verify voltages are set so as to satisfy the relation Y1=Y2=Y3=Y4=Y5=Y6=Y7. However, the differences Y1 to Y7 may be set so as to satisfy the relation Y1≤Y2≤Y3≤Y4≤Y5≤Y6≤Y7.

In the above-described embodiments, two cases before and after deterioration are described, but the invention is not limited to the two cases. The read voltage and the write verify voltage may be changed any number of times. A plurality of determination values may be set in Steps S12 and S22 of FIGS. 10 and 11 and three or more read voltages and write verify voltages may be set. When the read voltages and the write verify voltages are changed before and after the memory cell MC deteriorates, the read operation and the write verify operation suitable for the state of the memory cell MC may be performed. As a result, an error may be prevented in the read operation due to the deterioration of the memory cell MC.

What is claimed is:

1. A nonvolatile semiconductor memory device comprising:
   a plurality of memory cells each configured to hold a threshold voltage included in any one of a plurality of threshold voltage distributions;
   a memory cell array having NAND cell units arranged therein, each of the NAND cell units including a memory string and selection transistors, the memory string configured by the memory cells connected in series, and one of the selection transistors being connected to each end of the memory string, respectively;

word lines connected to the memory cells;

bit lines each connected to first end of the NAND cell unit;

a source line connected to second ends of the NAND cell units; and a control circuit configured to control a read operation, a write operation, and a write verify operation, the read operation being an operation of selecting one of the memory cells as a selected memory cell and applying a read voltage to a selected word line connected to the selected memory cell to read data, the write operation being an operation of writing data to the selected memory cell, and the write verify operation being an operation of applying a verify voltage to the selected word line and determining whether a certain data is written to the selected memory cell, in a first case, the control circuit setting a voltage applied to the selected word line to a first write verify voltage to perform the write verify operation, and setting a voltage applied to the selected word line to a first read voltage to perform the read operation, in a second case in which the memory cells deteriorate more than in the first case, the control circuit setting a voltage applied to the selected word line to a second write verify voltage to perform the write verify operation, and setting a voltage applied to the selected word line to a second read voltage to perform the read operation, and the control circuit setting a difference between a maximum value of the first write verify voltage and a maximum value of the first read voltage to a value more than a difference between a maximum value of the second write verify voltage and a maximum value of the second read voltage.

2. The nonvolatile semiconductor memory device according to claim 1, wherein a plurality of combinations of the first write verify voltage and the first read voltage are formed so as to correspond to the plurality of threshold voltage distributions, and wherein the difference between the first write verify voltage and the first read voltage in the combination corresponding to the threshold voltage distribution with a maximum threshold voltage among the plurality of threshold voltage distributions is more than the difference between the first write verify voltage and the first read voltage in the combinations corresponding to the other threshold voltage distributions.

3. The nonvolatile semiconductor memory device according to claim 1, wherein the control circuit sets the first write verify voltage and the second write verify voltage corresponding to one of the threshold voltage distributions to different values.

4. The nonvolatile semiconductor memory device according to claim 3, wherein the control circuit sets the first write verify voltage corresponding to one of the threshold voltage distribution to a value equal to or less than the second write verify voltage corresponding to the same threshold voltage distribution.

5. The nonvolatile semiconductor memory device according to claim 1, wherein the control circuit sets the first read voltage and the second read voltage corresponding to one of the threshold voltage distributions to different values.

6. The nonvolatile semiconductor memory device according to claim 5, wherein the control circuit sets the first read voltage corresponding to one of the threshold voltage distribution to a value equal to or less than the second read voltage corresponding to the same threshold voltage distribution.

7. The nonvolatile semiconductor memory device according to claim 1, wherein the control circuit sets the difference between the maximum value of the second write verify voltage and a minimum value of the second read voltage to a value larger than the difference between the maximum value of the first write verify voltage and a minimum value of the first read voltage.

8. The nonvolatile semiconductor memory device according to claim 1, wherein the first case and the second case are changed on the basis of the number of write operations and erase operations.

9. The nonvolatile semiconductor memory device according to claim 1, wherein the first case and the second case are changed on the basis of the number of times an erase pulse voltage is applied during an erase operation.

10. A nonvolatile semiconductor memory device comprising:

a plurality of memory cells each configured to hold a threshold voltage included in any one of a plurality of threshold voltage distributions;

a memory cell array having NAND cell units arranged therein, each of the NAND cell units including a memory string and selection transistors, the memory string configured by the memory cells connected in series, and one of the selection transistors being connected to each end of the memory string, respectively;

word lines connected to the memory cells;

bit lines each connected to first end of the NAND cell unit;

a source line connected to second ends of the NAND cell units; and a control circuit configured to control a read operation, a write operation, and a write verify operation, the read operation being an operation of selecting one of the memory cells as a selected memory cell and applying a read voltage to a selected word line connected to the selected memory cell to read data, the write operation being an operation of writing data to the selected memory cell, and the write verify operation being an operation of applying a verify voltage to the selected word line and determining whether a certain data is written to the selected memory cell, in a first case, the control circuit setting a voltage applied to the selected word line to a first write verify voltage to perform the write verify operation, and setting a voltage applied to the selected word line to a first read voltage to perform the read operation, in a second case in which the memory cells deteriorate more than in the first case, the control circuit setting a voltage applied to the selected word line to a second write verify voltage different from the first write verify voltage to perform the write verify operation, and setting a voltage applied to the selected word line to a second read voltage different from the first read voltage to perform the read operation.

11. The nonvolatile semiconductor memory device according to claim 10,
wherein the control circuit sets the first write verify voltage corresponding to one of the threshold voltage distributions to a value equal to or less than the second write verify voltage corresponding to the same threshold voltage distribution.

12. The nonvolatile semiconductor memory device according to claim 10,
wherein the control circuit sets the first read voltage corresponding to one of the threshold voltage distributions to a value equal to or less than the second read voltage corresponding to the same threshold voltage distribution.

13. The nonvolatile semiconductor memory device according to claim 10,
wherein a plurality of combinations of the first write verify voltage and the first read voltage are formed so as to correspond to the plurality of threshold voltage distributions, and
wherein a difference between the first write verify voltage and the first read voltage in the combination corresponding to the threshold voltage distribution with a maximum threshold voltage among the plurality of threshold voltage distributions is more than the difference between the first write verify voltage and the first read voltage in the combinations corresponding to the other threshold voltage distributions.

14. The nonvolatile semiconductor memory device according to claim 10,
wherein the control circuit sets a difference between a maximum value of the second write verify voltage and a minimum value of the second read voltage to a value larger than a difference between a maximum value of the first write verify voltage and a minimum value of the first read voltage.

15. The nonvolatile semiconductor memory device according to claim 10,
wherein the first case and the second case are changed on the basis of the number of write operations and erase operations.

16. The nonvolatile semiconductor memory device according to claim 10,
wherein the first case and the second case are changed on the basis of the number of times an erase pulse voltage is applied during an erase operation.

17. A nonvolatile semiconductor memory device comprising:
a plurality of memory cells each configured to hold a threshold voltage included in any one of a plurality of threshold voltage distributions;
a memory cell array having NAND cell units arranged therein, each of the NAND cell units including a memory string and selection transistors, the memory string configured by the memory cells connected in series, and one of the selection transistors being connected to each end of the memory string, respectively;
word lines connected to the memory cells;
bit lines each connected to first end of the NAND cell unit;
a source line connected to second ends of the NAND cell units; and
a control circuit configured to control a read operation, a write operation, and a write verify operation, the read operation being an operation of selecting one of the memory cells as a selected memory cell and applying a read voltage to a selected word line connected to the selected memory cell to read data, the write operation being an operation of writing data to the selected memory cell, and the write verify operation being an operation of applying a write verify voltage to the selected word line and determining whether a certain data is written to the selected memory cell,
a plurality of combinations of the write verify voltage and the read voltage being formed so as to correspond to the plurality of threshold voltage distributions, and
the control unit setting a difference between the write verify voltage and the read voltage corresponding to the threshold voltage distribution with a certain value to a value equal to or more than a difference between the write verify voltage and the read voltage corresponding to the threshold voltage distribution with a value less than the certain value.

18. The nonvolatile semiconductor memory device according to claim 17,
wherein the control circuit sets a difference between the write verify voltage and the read voltage corresponding to the threshold voltage distribution with a maximum value to a value more than a difference between the write verify voltage and the read voltage corresponding to the threshold voltage distribution with a minimum value.

19. The nonvolatile semiconductor memory device according to claim 17,
wherein the control circuit sets the differences between the write verify voltages and the read voltages corresponding to the threshold voltage distributions other than the threshold voltage distribution with the maximum value to be equal to each other.

20. The nonvolatile semiconductor memory device according to claim 17,
wherein the control circuit is configured to be capable of changing the write verify voltage and the read voltage.

* * * * *